United States Patent [19]

Wu

[11] Patent Number: 5,717,163

[45] Date of Patent: Feb. 10, 1998

[54] PLASTIC MATERIAL POURING DEVICE FOR FORMING ELECTRONIC COMPONENTS

[76] Inventor: Conny Wu, No. 5-1, Alley 25, Lane 156, Wu Hsing St., Taipei, Taiwan

[21] Appl. No.: 352,731

[22] Filed: Dec. 2, 1994

[51] Int. Cl.[6] .............................. H01L 23/28; H01L 23/01
[52] U.S. Cl. ............................ 174/52.2; 174/52.4
[58] Field of Search ........................ 361/807, 809, 361/813, 728, 730, 733, 772, 773; 257/687, 670, 671, 672, 673, 693, 694, 695, 731, 704, 710; 174/52.4; 336/90, 52.2

[56] References Cited

U.S. PATENT DOCUMENTS 3,469,684  9/1969  Keady et al. ...................... 361/809
3,691,289  9/1972  Rohloff ............................. 174/52
5,208,467  5/1993  Yamazaki .......................... 257/667

*Primary Examiner*—Hyung S. Sough
*Assistant Examiner*—Hung V. Ngo
*Attorney, Agent, or Firm*—Bacon & Thomas

[57] ABSTRACT

Disclosed is a plastic material pouring device for forming electronic components consisting of a cover and a leadframe corresponding to the cover in configuration, such that the cover is firmly joined and assembled with the leadframe with the help of a suitable tool to allow quick pouring of plastic material into the assembled cover and leadframe to form a desired electronic component. Such plastic material pouring device requires less material and reduced manufacturing cost while permits the leadframe to be produced in sheet form in a continuous manner and to have pins with desired shapes.

4 Claims, 3 Drawing Sheets

PLASTIC MATERIAL POURING DEVICE FOR FORMING ELECTRONIC COMPONENTS

BACKGROUND OF THE INVENTION

1. Field of the Invention

The present invention relates to a plastic material pouring device for forming electronic components, and more particularly to a plastic material pouring device in which the leadframe can be produced in sheet form in a continuous manner with less material and at lower cost while the leadframe may be formed with pins having any desired configuration.

2. Description of the Prior Art

A conventional plastic material pouring device for forming electronic components, as shown in FIG. 1, usually includes a pre-formed base 1 and a cover 2. The base 1 includes a plastic injection molded base board 11 and a leadframe 12 formed at the sides of the base board 11. The leadframe 12 includes two rows of parallelly aligned top pins 13 and two rows of parallelly aligned insertion pins 14. The top pins 13 are formed on an upper surface of the base board 11 and the insertion pins 14 are formed at a lower surface of the base board 11. The cover 2 is a hollow body with an opening 21 formed at a top or an end surface thereof. The cover 2 has a configuration corresponding to that of the base board 11 such that an inner top surface of the cover 2 presses against the top pins 13 of the base 1 while the cover 2 is covered onto the base 1. When a predetermined plastic material is poured from the opening 21 into the cover 2 and fills the same, a cover-type electronic component is formed.

Following disadvantages exist in the above-mentioned conventional plastic material pouring device for forming electronic component though such device has been used for many years:

1. The base must be formed before the cover can be assembled with the leadframe and therefore, longer manufacturing time is required while the productivity is reduced.
2. Increased material and production cost is required to form the base.
3. The formed base does not permit acceptable elasticity to change the insertion pins thereof and therefore, it is difficult to change the insertion pins to be vertical or SMD pins in accordance with the actual need of the electronic component.
4. The leadframe is formed together with the base and is not easy to be produced in a continuous manner and therefore, requires higher unit production cost.

It is therefore tried by the inventor to develop a plastic material pouring device for electronic components to eliminate the shortcomings existed in the conventional ones.

SUMMARY OF THE INVENTION

A primary object of the present invention is to provide a plastic material pouring device for forming electronic components in which the leadframe thereof can be directly and fixedly joined with the cover at the time of pouring plastic material without the need to first form a base and thereby reduces the required material and production cost.

Another object of the present invention is to provide a plastic material pouring device for forming electronic components in which the leadframe can be produced in sheet form in a continuous manner to lower the unit production cost thereof.

A further object of the present invention is to provide a plastic material pouring device for forming electronic components in which the leadframe may be formed to have insertion pins with desired configuration after the leadframe is fixedly assembled with the cover through pouring plastic material into the cover.

BRIEF DESCRIPTION OF THE DRAWINGS

The detailed structure, applied principles, functions, and performance of the present invention can be best understood through the following detailed description of the preferred embodiments and the accompanying drawings, wherein.

DETAILED DESCRIPTION OF THE PREFERRED EMBODIMENTS

Figure 1:
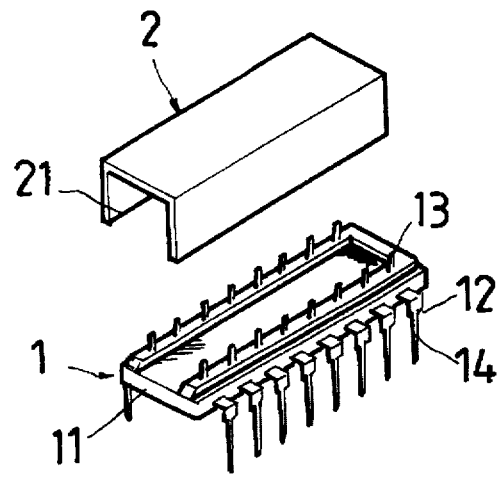
FIG. 1 illustrates a conventional plastic material pouring device for forming electronic components.
Figure 2:
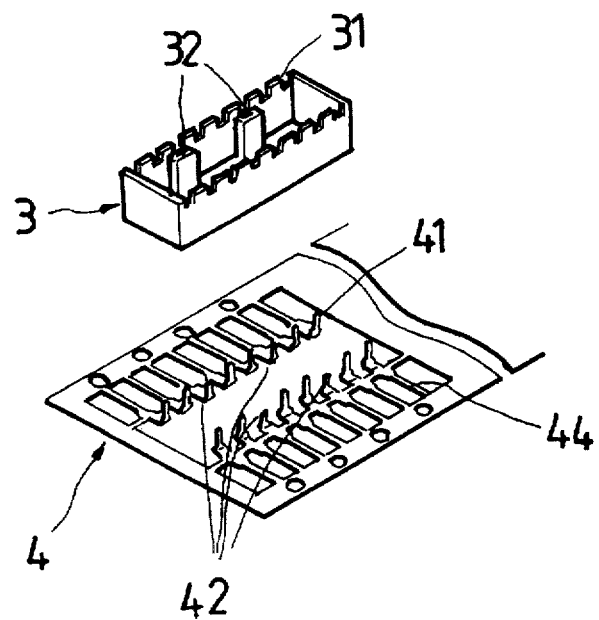
FIG. 2 is a disassembled perspective of a first embodiment of the plastic material pouring device for forming electronic components according to the present invention.

Please refer to FIG. 2. The present invention is a plastic material pouring device for forming electronic components and mainly includes a cover 3 and a leadframe 4. The cover 3 is formed with two battlement-shaped lower edges such that continuous but spaced indents 31 are formed on the two edges. Locating holes 32 are provided inside the cover 3. The leadframe 4 is formed with two rows of spaced and upward projecting aligned pins 41. A locating top pin 42 is provided between every two aligned top pins 41, such that when the cover 3 is covered onto the leadframe 4, the aligned top pins 41 just press against an inner top surface of the cover 3 while the locating top pins 42 insert into the locating holes 32 of the cover 3. By this way, the cover 3 is firmly positioned onto the leadframe 4 without the risk of swinging sidewardly.

When pouring plastic material into the cover 3, the cover 3 is first firmly pressed onto the leadframe 4 with the help of a suitable tool until the cover 3 is fully fitted on the leadframe 4. Then, plastic material is poured into the cover 3 through its bottom opening. The plastic pouring for an electronic component can thereby be quickly completed.

Figure 3:
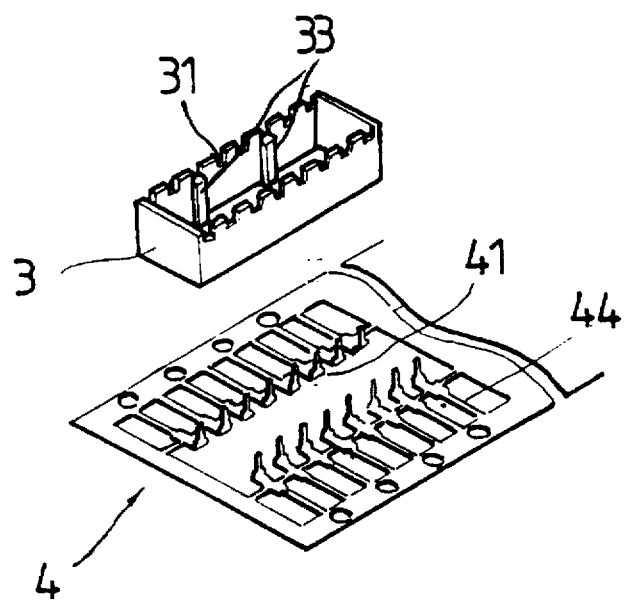
FIG. 3 is disassembled perspective of a second embodiment of the plastic material pouring device according to the present invention.

FIG. 3 illustrates another embodiment of the present invention wherein the leadframe 4 is formed with two rows of top pins 41 without any locating top pin 42 while locating ribs 33 are formed on the inner side surfaces of the cover 3 to replace the locating holes 32 in the first embodiment of the present invention. When the cover 3 is covered onto the leadframe 4, top pins 41 corresponding to the locating ribs 33 shall clamp the same between them and thereby fix the cover 3 onto the leadframe 4.

Figure 4:
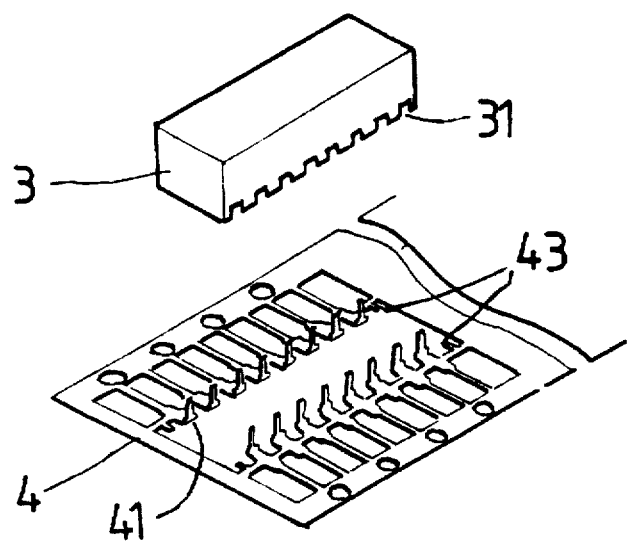
FIG. 4 is a disassembled perspective of a third embodiment of the plastic material pouring device according to the present invention.

FIG. 4 illustrates a third embodiment of the present invention wherein the leadframe 4 is formed with locating pins 43 such that when the cover 3 is covered onto the leadframe 4, the locating pins 43 press against the inner top surface of the cover 3 to firmly fix the cover 3 to the leadframe 4.

Figure 5:
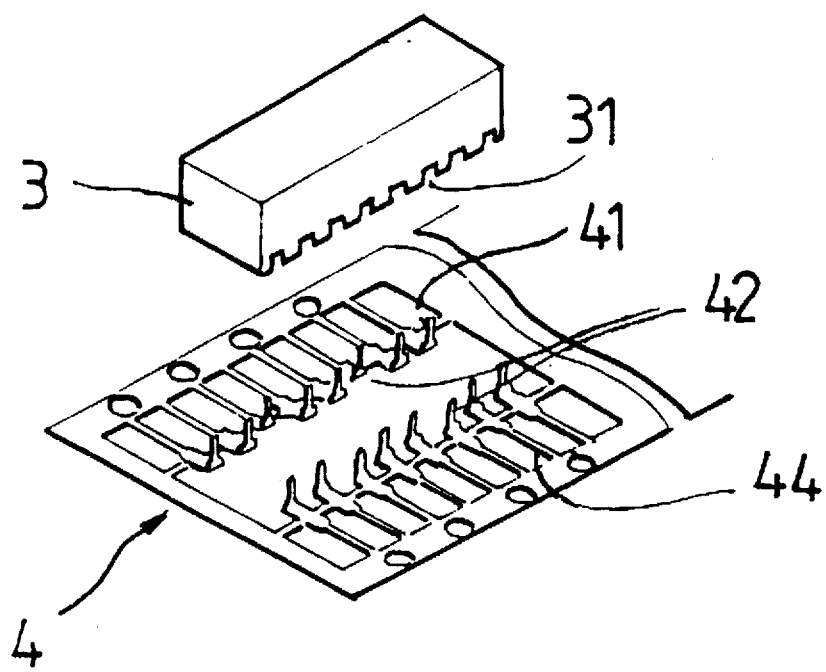
FIG. 5 is a disassembled perspective of a fourth embodiment of the plastic material pouring device according to the present invention.

FIG. 5 illustrates a fourth embodiment of the present invention wherein locating top pins 42 are separately formed on the leadframe 4 between every two aligned top pins 41 but at positions a little backward than those of the top pins 41, such that when the cover 3 is covered onto the leadframe 4, the aligned top pins 41 just press against the inner top surface of the cover 3 with the locating top pins 42 inserting into the corresponding indents 31 of the cover 3 and thereby fix the cover 3 to the leadframe 4.

The plastic material pouring device for forming electronic components according to the present invention has a leadframe 4 which may be fixedly assembled with the cover 3 by directly covering the cover 3 onto the leadframe 4 and pouring the plastic material into the cover 3. With this design, the plastic material pouring device may be produced in sheet form in a continuous manner without the necessity to form a base first and therefore can be made at reduced unit manufacturing cost. Moreover, since the aligned insertion pins 44 of the leadframe 4 are not bent when they are formed, they can be vertical or SMD-type insertion pins depending on the actual need and therefore have considerably big flexibility in their applications.

From the above description, it can be seen that the plastic material pouring device for forming electronic components of the present invention has the advantages of reduced material and manufacturing cost, continuously producible leadframe, and insertion pins of leadframe with desired configuration to improve the conventional plastic material pouring device.

It should be noted the above embodiments are only used for illustration and are not intended to limit the scope of the present invention. Many modifications of these embodiments can be made without departing from the spirit of the present invention.

What is claimed is:

1. A plastic material pouring device for forming electronic components comprising a cover having an inner top surface and a bottom opening and a leadframe provided with two rows of aligned top pins wherein said cover is directly covered onto said leadframe with said aligned top pins of said leadframe pressing against said inner top surface of said cover, such that said cover and said leadframe are firmly assembled and that said assembled cover and leadframe can be directly filled with plastic material from said bottom opening of said cover to quickly complete the plastic pouring to form an electronic component, wherein said cover further comprises inner surfaces with locating holes and said leadframe is provided between every two aligned top pins with a locating top pin at positions corresponding to said locating holes of said cover, such that said locating top pins engage into said locating holes to firmly join said cover with said leadframe when said cover is covered onto said leadframe.

2. A plastic material pouring device for forming electronic components comprising a cover having an inner top surface and a bottom opening and a leadframe provided with two rows of aligned top pins wherein said cover is directly covered onto said leadframe with said aligned top pins of said leadframe pressing against said inner top surface of said cover, such that said cover and said leadframe are firmly assembled and that said assembled cover and leadframe can be directly filled with plastic material from said bottom opening of said cover to quickly complete the plastic pouring to form an electronic component, wherein said cover further comprises inner surfaces with locating ribs, located such that said aligned top pins of said leadframe clamp said locating ribs at two sides thereof and thereby firmly join said cover with said leadframe.

3. A plastic material pouring device for forming electronic components comprising a cover having an inner top surface and a bottom opening and a leadframe provided with two rows of aligned top pins wherein said cover is directly covered onto said leadframe with said aligned top pins of said leadframe pressing against said inner top surface of said cover, such that said cover and said leadframe are firmly assembled and that said assembled cover and leadframe can be directly filled with plastic material from said bottom opening of said cover to quickly complete the plastic pouring to form an electronic component, wherein said leadframe further comprises locating pins formed at two outer ends to facilitate the assembling of said cover with said leadframe.

4. A plastic material pouring device for forming electronic components comprising a cover having an inner top surface and a bottom opening and a leadframe provided with two rows of aligned top pins wherein said cover is directly covered onto said leadframe with said aligned top pins of said leadframe pressing against said inner top surface of said cover, such that said cover and said leadframe are firmly assembled and that said assembled cover and leadframe can be directly filled with plastic material from said bottom opening of said cover to quickly complete the plastic pouring to form an electronic component, wherein said cover further comprises two lower side edges with a plurality of spaced indents, and wherein said leadframe is provided between every two aligned top pins with a locating top pin laterally spaced from said aligned top pins of said leadframe, such that said locating top pins are retained in said indents of said cover and fixedly join said cover with said leadframe when said cover is covered onto said leadframe.

* * * * *